United States Patent [19]

Murakami et al.

[11] Patent Number: 5,192,928
[45] Date of Patent: Mar. 9, 1993

[54] CIRCUIT ELEMENT HAVING FERRIMAGNETIC FILM WITH DEVIATED END SURFACES FOR SUPPRESSING SPURIOUS MAGNETOSTATIC WAVE RESONANCE MODES

[75] Inventors: Yasuhide Murakami, Kumagaya; Kohei Ito, Fukaya, both of Japan

[73] Assignee: Hitachi Metals, Ltd., Tokyo, Japan

[21] Appl. No.: 754,565

[22] Filed: Sep. 4, 1991

[30] Foreign Application Priority Data

Sep. 5, 1990 [JP] Japan ................................. 2-234974

[51] Int. Cl.⁵ ............................................. H01P 1/215
[52] U.S. Cl. ................................. 333/219.2; 333/245
[58] Field of Search ............... 333/201, 202, 204, 205, 333/219, 219.2, 235, 246, 245

[56] References Cited

U.S. PATENT DOCUMENTS

| | | | |
|---|---|---|---|
| 4,251,786 | 2/1981 | Goldie et al. | 333/219.2 X |
| 4,565,984 | 1/1986 | Castera et al. | 333/202 |
| 4,743,874 | 5/1988 | Kinoshita et al. | 333/219 |
| 5,017,895 | 5/1991 | Buck et al. | 333/202 X |
| 5,017,896 | 5/1991 | Adam et al. | 333/219.2 X |

FOREIGN PATENT DOCUMENTS 62-245704 10/1987 Japan .
2-131101(A) 1/1990 Japan .
2-298101 12/1990 Japan .

OTHER PUBLICATIONS

IEEE Transactions on Magnetics, vol. MAG-20, No. 5, Sep. 1984, pp. 1232-1234 entitled, "MSSW Resonators with Straight Edge Reflectors".
Journal of Applied Physics vol. 36, No. 11, Nov. 1965, pp. 3453-3459 "Propagation of magnetostatic Spin Wave at Microwave Frequencies in a Normally-Magnetized Disk*" by R. W. Damon and H. Van De Vaart.

*Primary Examiner*—Paul M. Dzierzynski
*Assistant Examiner*—Seung Ham
*Attorney, Agent, or Firm*—Finnegan, Henderson, Farabow, Garrett & Dunner

[57] ABSTRACT

A circuit element utilizing a magnetostatic wave is disclosed which uses a magnetostatic-wave resonator having a structure wherein a thin YIG (yttrium iron garnet) film is formed on a non-magnetic substrate such as a GGG (gadolium gallium garnet) substrate and defining a wave propagation plane. In this resonator, at least a part of end faces of the YIG film are inclined at an angle of 2° or more to a plane perpendicular to the wave propagation plane to suppress the generation of unnecessary spurious modes in a wide frequency range.

10 Claims, 4 Drawing Sheets

AFTER END FACE OF
MAGNETIC FILM HAS
BEEN PROCESSED

CIRCUIT ELEMENT HAVING FERRIMAGNETIC FILM WITH DEVIATED END SURFACES FOR SUPPRESSING SPURIOUS MAGNETOSTATIC WAVE RESONANCE MODES

BACKGROUND OF THE INVENTION

The present invention relates to a circuit element utilizing spin resonance in a thin magnetic film such as a thin YIG (yttrium iron garnet) film formed on a non-magnetic substrate such as GGG (gadolinium gallium garnet) substrate, and more particularly to the structure of a circuit element utilizing a magnetostatic wave, for suppressing a spurious mode and for enabling the circuit element to operate in a wide frequency range.

It has been proposed to use a thin-film ferrimagnetic resonator having a structure that a thin YIG film is deposited by liquid phase epitaxy on a non-magnetic substrate made of GGG, and then the YIG film is selectively removed so as to have a desired shape, in a microwave oscillation circuit or the like. (refer to a Japanese Patent Application JP-A-2-13101 and others).

This thin-film ferrimagnetic resonator has advantages that the resonance sharpness Q of the resonator is high in the microwave frequency band, and the resonance frequency thereof can be varied depending upon the intensity of a D.C. bias magnetic field applied perpendicularly to the thin ferrimagnetic film coupled magnetically with a transmission line.

Further, a resonator utilizing thin-film ferrimagnetic resonance has been proposed, in which the microwave transmission line is formed on the thin ferrimagnetic film by photolithographic techniques, to adjust the coupling between the thin ferrimagnetic film and the transmission line readily and to enhance the degree of coupling therebetween. (refer to Japanese Patent Application JP-A-62-245704 and others).

As is well known when it is supposed that the volume of a magnetic medium is infinite, the spin resonance occurs abruptly in the magnetic medium when the frequency of an applied microwave becomes equal to a Larmor frequency corresponding to an applied magnetic field. At this time, the phase of spin is constant in the whole of the magnetic medium. That is, the spin in the medium is put in a uniform resonance state. In fact, the volume of a magnetic medium is finite. Accordingly, in order to reduce the magnetostatic energy of the whole of the magnetic medium in accordance with a boundary condition, the phase of spin varies gradually in the magnetic medium. At this time, the change of phase shows the property of a wave. Thus, the change of phase of spin is called "magnetostatic wave".

FIG. 2A shows an example of a conventional circuit element utilizing a magnetostatic wave, and FIG. 2B shows a magnetostatic-wave resonator used in the circuit element of FIG. 2A.

Referring to FIG. 2B, a magnetostatic-wave resonator 6 is formed in such a manner that a thin YIG film 3 is deposited on a GGG substrate 2 by liquid phase epitaxy, a gold or aluminum film is deposited on the YIG film 3 and one or more finger electrodes 5 and a pair of pad electrodes 4a and 4b are formed of a gold or aluminum film deposited on the YIG film 3 through photolithographic techniques so that the pad electrodes 4a and 4b are disposed on both sides of each finger electrode 5. A conventional circuit element 1 shown in FIG. 2A employs the magnetostatic-wave resonator 6 of FIG. 2B. In FIG. 2A, reference numeral 1 designates the circuit element, 6 the magnetostatic-wave resonator, 7 a matching stub, 11 a con-ducts plate, 12a and 12b connecting plates, 13 an conductive plate, 14 a dielectric material, and 15 a microstrip line.

Owing to the mechanism of resonance, the above circuit element using the thin YIG film can operate at temperatures lower than the operation temperature of a conventional circuit element using a YIG sphere. Moreover, the former circuit element of FIG. 2A is relatively inexpensive, because a cumbersome step of forming the YIG sphere is not required.

In a case where, as shown in FIG. 2A, an external magnetic field $H_o$ is applied in a direction perpendicular to the finger electrodes and the thin YIG film, the magnetostatic wave is propregated, as a volume wave, in directions perpendicular to the finger electrodes and parallel to the thin YIG film.

When the band pass characteristics of the circuit element 1 of FIG. 2A are measured, a spurious mode frequently appears in the neighborhood of the lowest one of resonance modes, as shown in FIG. 3A. In many cases, the dependence of the resonance frequency of the spurious mode on the external magnetic field differs a little from the external magnetic field dependence of the resonance frequency of the lowest resonance mode. Accordingly, as shown in FIG. 3B, the positional relation between the spurious mode and the lowest resonance mode varies with a resonance frequency.

The above fact will be explained below in more detail, with reference to FIGS. 3A and 3B. FIG. 3A shows the spurious mode. Referring to FIG. 3A, a small peak deviating from a main peak indicates the spurious mode. When a resonance spectrum is observed while changing the resonance frequency of the lowest resonance mode by increasing the intensity of the external magnetic field $H_o$ gradually, the spurious mode appearing on one side of the peak due to the lowest resonance mode gradually approaches the peak, passed through the peak, and then moves to the other side of the peak. (refer to LEEE TRANS on MAGNETICS vol. MAG-20, No. 5, Sep. 1984)

Thus, in a case where the above magnetostatic-wave resonator is used for forming, for example, a microwave oscillation circuit, when the operating point of the oscillation circuit on a Smith chart passes through the resonance frequency of the spurious mode as shown in FIG. 4A, the oscillation frequency changes discontinuously as shown in FIG. 5A. That is, there arises a problem that a mode jump of the order of 1 MHz appears. Further, when the spurious mode and the lowest resonance mode overlap each other, the peak due to the lowest resonance mode becomes dull. Thus, there arises another problem that a resonance shapness Q is reduced to a great degree.

SUMMARY OF THE INVENTION

It is an object of the present invention to provide the structure of a circuit element utilizing a magnetostatic wave for suppressing the spurious mode in a wide frequency range.

In order to attain the above object, according to the present invention, there is provided a circuit element utilizing a magnetostatic wave which circuit element comprises: means for exciting a magnetostatic wave in a first plane and a medium for propagating the magnetostatic wave, at least a part of end faces of the medium being deviated from a second plane perpendicular to the first plane in which the magnetostatic wave is propagated.

In more detail, according to an aspect of the present invention, there is provided a circuit element utilizing a magnetostatic wave which employs a magnetostatic-wave resonator having a structure wherein a thin ferrimagnetic film is formed on a non-magnetic substrate, at least one finger electrode and a pair of pad electrodes are formed on the ferrimagnetic film to excite and propagate a magnetostatic wave in the ferrimagnetic film by a microwave, thereby generating resonance, and at least a part of end faces of the ferrimagnetic film are deviated from a plane perpendicular to the film in which the magnetostatic wave is propagated.

According to another aspect of the present invention, there is provided a circuit element utilizing a magnetostatic wave which employs a magnetostatic-wave resonator having a structure wherein a thin ferrimagnetic film is formed on a non-magnetic substrate, electrodes are formed on another substrate so that a magnetostatic wave is excited and propagated in the ferrimagnetic film by a microwave applied to the electrodes, to generate resonance, and at least a part of end faces of the ferrimagnetic film are deviated from a plane perpendicular to the film in which the magnetostatic wave is propagated.

According to a further aspect of the present invention, there is provided a circuit element utilizing a magnetostatic wave, in which opposing end portions of a thin ferrimagnetic film for propagating a magnetostatic wave are tapered relative to each other.

According to still another aspect of the present invention, there is provided a circuit element utilizing a magnetostatic wave, in which at least a part of end faces of a thin ferrimagnetic film for propagating a magnetostatic wave are inclined at an angle of 2° or more to a plane perpendicular to in film in which the magnetostatic wave is propagated.

Still a further aspect of the present invention, there is provided a circuit element utilizing a magnetostatic wave, in which at least a part of end faces of a thin ferrimagnetic film for propagating a magnetostatic wave are formed stepwise.

In a case where a magnetic medium has a special shape, the dispersion of a magnetostatic wave in the medium can be calculated by using a convenient approximation, and thus it is known that a multiplicity of modes are formed for a single boundary condition (refer to Journal of Applied Physics Vol. 36, No. 11, Nov. 1965).

Although the above-mentioned spurious mode is to be determined from the boundary condition and the properties of the magnetic film, it is very difficult to know which of resonance modes is the spurious mode. The present inventors have inferred, in relation to the dispersion of frequencies, that each of most spurious modes shows a non-uniform change of magnetization in the direction of thickness of the magnetic film, that is, a higher mode when viewed in the direction of thickness of the magnetic film, and moreover the spurious mode is a higher resonance mode in the surface of the ferrimagnetic film.

When the magnetostatic wave is considered to be a kind of wave, the end face of the magnetic film acts as a wave reflecting wall. That is, in a magnetostatic wave resonator, the magnetostatic wave is confined in the magnetic film whose end face acts as the reflecting surface and a magnetostatic wave produces a resonance mode only when both the wave incident to the reflecting surface and the wave reflected from the reflecting surface have the same phase and intensity.

Accordingly, when viewed macroscopically, the reflecting wall of the magnetic film would be required to be perpendicular to the propagation direction of the magnetostatic wave to have the same phase and intensity. In a case where the reflecting wall is deviated from a plane perpendicular to the propagation plane, the magnetostatic wave is reflected from the reflecting wall in different directions, that is, the magnetostatic wave is scattered, and thus the resonance condition is not satisfied.

In an ordinary magnetostatic-wave resonator using the thin ferrimagnetic film, however, a resonance mode having the smallest wave number and a long wavelength is mainly used. Accordingly, the diffraction of the magnetostatic wave is remarkable in the vicinity of the reflecting surface, and hence the generation of the main resonance mode will not be prevented by the deviation of end faces of the magnetic film from directions perpendicular to the propagation plane of the magnetostatic wave. On the other hand, a higher resonance mode in the direction of thickness of the magnetic film and in the plane parallel to the surface thereof, has a large wave number and a short wavelength. Accordingly, the generation of the higher resonance mode will be prevented by the deviation of end faces of the magnetic film from directions perpendicular to the propagation direction of the magnetostatic wave.

According to the present invention, the above fact is utilized to realize the structure of a magnetostatic-wave resonator for suppressing only unwanted spurious modes effectively without exerting an adverse effect on the generation of a main resonance mode.

DESCRIPTION OF THE PREFERRED EMBODIMENTS

The present invention will be explained below in detail, on the basis of embodiments thereof.

EMBODIMENT-1

Figure 1:
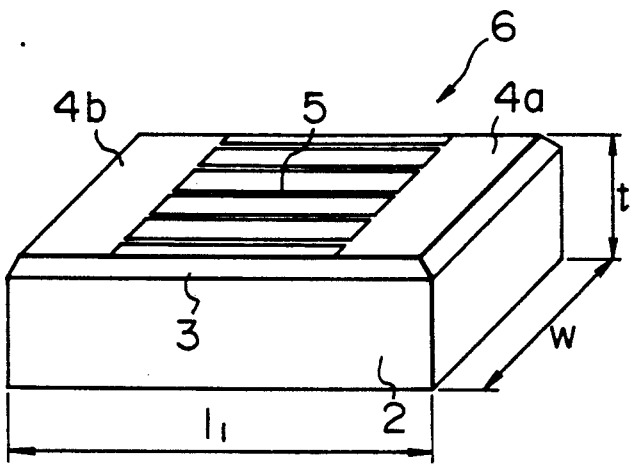
FIG. 1 is an explanatory view showing an embodiment of magnetostatic-wave resonator with an inclined resonating medium end face to the present invention.
Figure 2A:
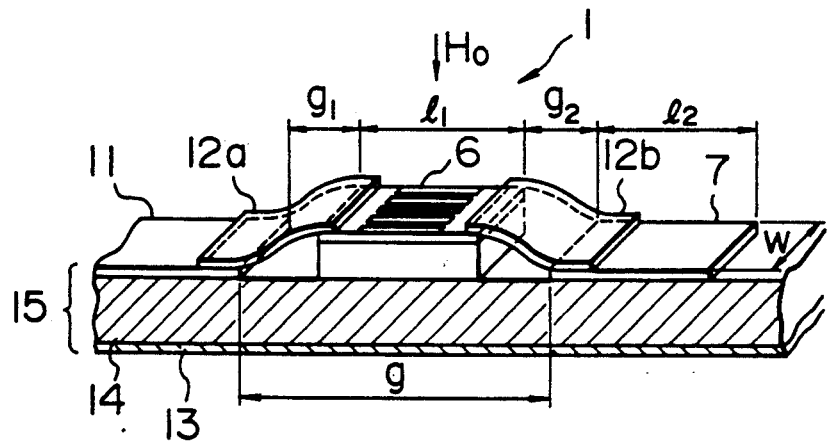
FIG. 2A is a diagram showing an example of a conventional circuit element utilizing a magnetostatic wave.
Figure 2B:
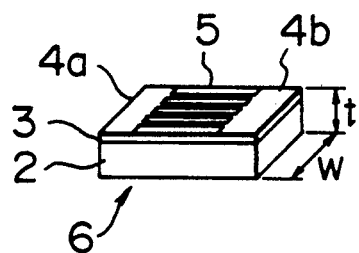
FIG. 2B is an explanatory view showing the conventional magnetostatic-wave resonator of FIG. 2A.
Figure 3A:
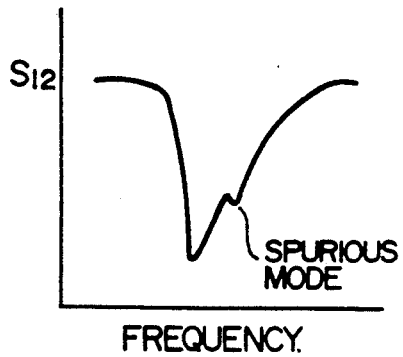
FIGS. 3A and 3B are graphs showing experimental band pass characteristics of the conventional circuit element of FIG. 2A.
Figure 3B:
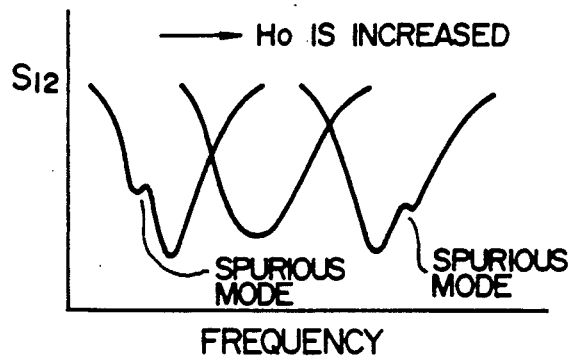
Figure 4A:
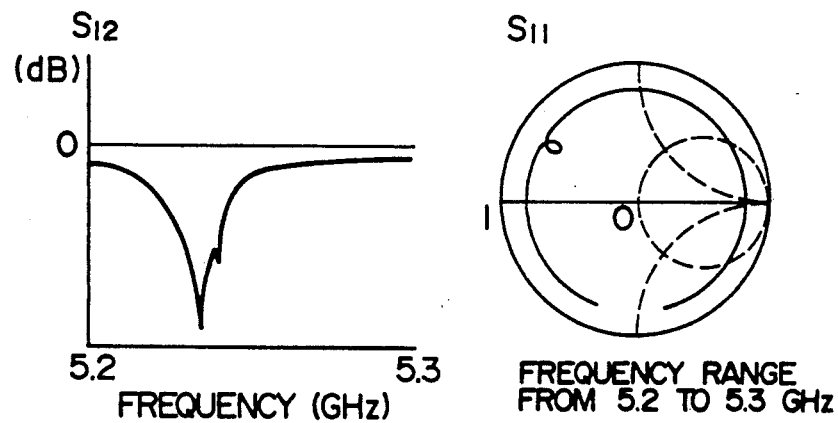
FIG. 4A shows experimental band pass and impedance characteristics of the conventional circuit element of FIG. 2A.
Figure 4B:
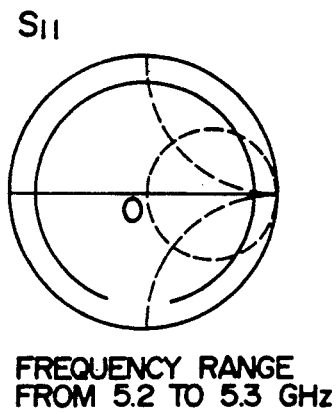
FIG. 4B shows experimental band pass and impedance characteristics of a magnetostatic-wave resonator according to the present invention.
Figure 5A:
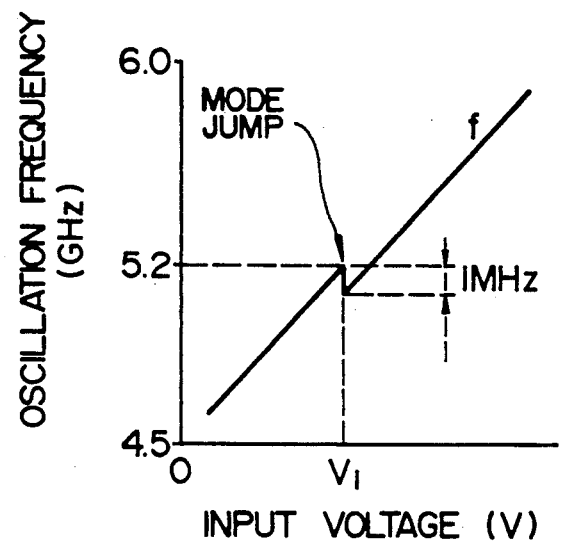
FIG. 5A is a graph showing oscillation-frequency characteristics of a magnetostatic-wave resonator obtained before end faces of a YIG film are processed, that is, oscillation-frequency characteristics of a conventional magnetostatic-wave resonator.
Figure 5B:
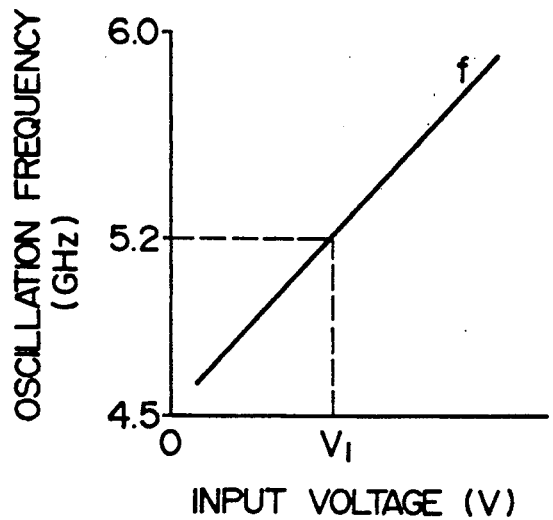
FIGS. 5B is a graph showing oscillation frequency characteristics of a magnetostatic-wave resonator obtained after end faces of a YIG film have been processed, that is, oscillation-frequency characteristics of the inventive magnetostatic-wave resonator.

FIG. 1 shows an embodiment of a magnetostatic-wave resonator according to the present invention. Referring to FIG. 1, a YIG film 3 having a thickness of about 40 μm is grown, by liquid phase epitaxy, on a monocrystalline GGG substrate 2. Next, a gold film having a thickness of 1.5 μm is formed on the YIG film 3 by the vacuum evaporation method. Then, the gold film is selectively etched off through photolithographic techniques, to form a plurality of finger electrodes 5 each having a width of 30 μm and a length of 3 mm and to form pad electrodes 4a and 4b on both sides of each finger electrode, as shown in FIG. 1. The wafer thus obtained is cut by a dicer having a diamond blade, to obtain a magnetostatic-wave resonator 6 having a length 1 of 5 mm, a width w of 2 mm and a thickness A of 0.5 mm.

Next, an end portion of the YIG film 3 parallel to the lengthwise direction of the resonator 6 is tapered. In order to taper the end portion, an abrasive jig has been made which can change an angle between the surface of the jig and a reference plane. Then, the resonator 6 is fixed to the surface of the jig by wax so that the lengthwise direction of the resonator 6 is parallel to an axis, around which the above angle is changed, that is, an angle changing axis.

Next, the face angle of the jig is adjusted while observing reflected light from the surface of the YIG film 3 by an angle-of-inclination measuring microcope, and the jig is fixed when the angle between the surface of the YIG film and the reference plane becomes equal to 1°, 2°, 5°, 10°, and 20°.

An end face of the resonator 6 fixed to the jig is lapped by using the No. 1200 abrasive grain of alumina. When it is observed by a microcope that the end face of the YIG film 3 is lapped and the lapped surface reaches the end face of the substrate 2, the lapping operation is completed.

The band pass characteristics of the resonator thus processed were measured. In a case where end faces of the YIG film were inclined at an angle of 1° to end faces of the substrate, a spurious mode was observed in the vicinity of a main resonance frequency of 5.0 to 5.3 GHz. In a case where end faces of the YIG film were inclined at an angle of 2° or more to end faces of the substrate, no spin mode was observed in a frequency range between a main resonance frequency of 5.0 to 5.5 GHz plus 20 MHz and the main resonance frequency minus 20 MHz.

EMBODIMENT-2

In the present embodiment, end portions of the YIG film on the pad-electrode sides are tapered by a lapping operation using the No. 1200 abrasive grain of alumina so that end faces of the YIG film are inclined at an angle of 10° to end faces of the substrate.

The band pass characteristics of the present embodiment were measured as in the EMBODIMENT-1. No spurious mode was observed in a frequency range between a main resonance frequency of 5.0 to 5.5 GHz plus 20 MHz and the main resonance frequency minus 20 MHz.

EMBODIMENT-3

A magnetostatic-wave resonator similar to that used in the EMBODIMENT-1 is prepared, and one of end faces of the YIG film parallel to the lengthwise direction (that is, parallel to the finger electrodes) is lapped so as to be inclined at an angle of 5° to the other end face.

The band pass characteristics of the resonator were measured as in the EMBODIMENT-1. No spurious mode was observed in a frequency range between a main resonance frequency of 5.0 to 5.5 GHz plus 20 MHz and the main resonance frequency minus 20 MHz.

EMBODIMENT-4

A magnetostatic-wave resonator similar to that used in the EMBODIMENT 1 is prepared, and one of end faces of the YIG film on the pad-electrode side is lapped so as to be inclined at an angle of about 5° to the other end face.

The band pass characteristics of the resonator were measured as in the EMBODIMENT-1. No spurious mode was observed in a frequency range between a main resonance frequency of 5.0 to 5.5 GHz plus 20 MHz and the main resonance frequency minus 20 MHz.

EMBODIMENT-5

A first magnetic-film chip 20 is prepared which has the structure of the magnetostatic-wave resonator of FIG. 1 except that the gold film is not present in the first magnetic-film chip 20 end faces 3a of the YIG film 3 parallel to the lengthwise direction of the chip are inclined at an angle of 2° to the end face of the substrate 2. Next, electrodes 22 configured in the same electrode pattern as shown in FIG. 1 are formed on a micro strip substrate 24. Further, a second magnetic-film chip (not depicted in the figures) is prepared which is different from the first magnetic-film chip only in that end faces of the YIG film 2 are parallel to the end face of the substrate 2.

The second magnetic-film chip was placed on the electrode pattern and fixed thereto by adhesives such as acrylic resin.

The band pass characteristics of the above combination of the magnetic-film chip and the electrode pattern were measured in a state that a magnetic field was applied to the YIG film, as in the EMBODIMENT-1. A spurious mode was observed in the vicinity of a main resonance frequency of 5.8 to 6.3 GHz. At this time, the peak of a main resonance mode was about 5 dB smaller than that in the EMBODIMENT-1.

Figure 6:
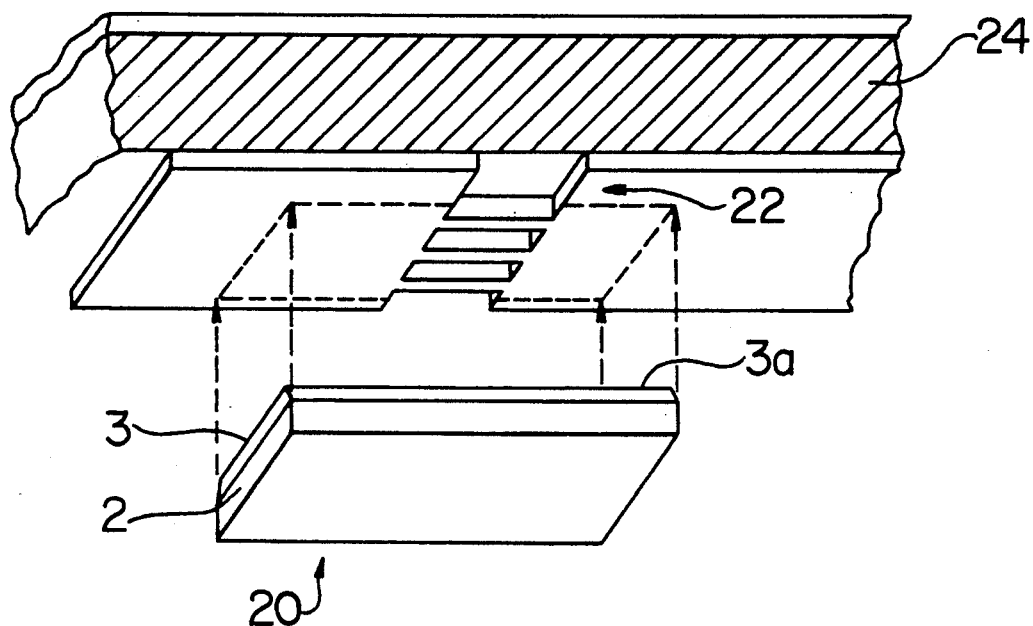
FIG. 6 is an exploded perspective view of variation of the embodiment of FIG. 1.

Next, the second magnetic-film chip was detached from the electrode pattern, and the first magnetic-film chip 20 was placed on the electrode pattern 22 of microstrip substrate 24 thereto as schematically depicted in FIG. 6.

The band pass characteristics of the combination of the first magnetic-film chip and the electrode pattern were measured in a state that a magnetic field is applied to the YIG film 3, as in the EMBODIMENT-1. No spurious mode was observed in a frequency range between a main resonance frequency of 5.8 to 6.3 GHz plus 20 MHz and the main resonance frequency minus 20 MHz.

That is, the present invention is effective even in a case where the electrode pattern is not deposited on the magnetic film.

EMBODIMENT-6

End faces of the YIG film parallel to the lengthwise direction of a resonator similar to that formed in the EMBODIMENT-1 are lapped by the No. 1200 abrasive grain of alumina. At this time, the lapped surface is inclined at an angle of 10° to the original end face. The lapping operation is performed while observing the lapped surface by a microscope. When a lapped area reaches the half of the thickness of the YIG film, the lapping operation is stopped.

The band pass characteristics of the resonator thus obtained were measured, as in the EMBODIMENT-1. No spurious mode was observed in a frequency range between a main resonance frequency of 5.0 to 5.5 GHz plus 20 MHz and the main resonance frequency minus 20 MHz.

EMBODIMENT-7

The present embodiment shows that the spurious mode can be suppressed by a method other than a method of tapering end portions of the magnetic film.

Figure 7:
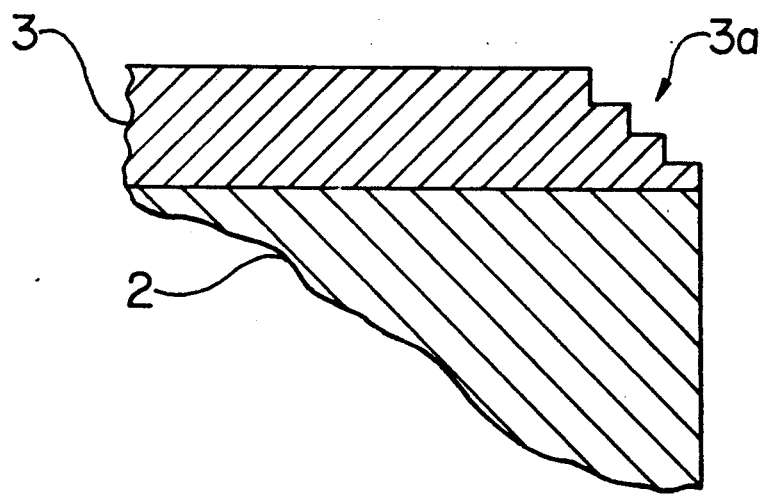
FIG. 7 is a schematic cross-section of another embodiment of the present invention having a stepped resonating medium end face.

A magnetostatic-wave resonator similar to that used in the EMBODIMENT-1 is prepared. The resonator is fixed to a precision surface grinder so that an and of the resonator on the pad-electrode side faces the grindstone. When the grindstone reaches the above end of the resonator, the depth of cut is changed by 10 $\mu$m and the amount of feeding is changed by 0.2 mm, each time the grindstone reaches the resonator. That is, at the above face 3a of the resonator, the depth of cut is changed at intervals of 0.2 mm. Thus, the end of the resonator is machined stepwise in the thickness direction. See FIG. 7.

The band pass characteristics of the resonator thus obtained were measured as in the EMBODIMENT-1. No spurious mode was observed in a frequency range between a main resonance frequency of 5.0 to 5.5 GHz plus 20 MHz and the main resonance frequency minus 20 MHz.

In the EMBODIMENT-1 to EMBODIMENT-7, a rectangular resonator has been explained, by way of example. The present invention is not limited to the rectangular resonator, but is applicable to others circuit elements such as a circular resonator, a filter and a delay line. That is, the present invention can suppress the generation of a spurious mode in such circuit elements.

As has been explained in the foregoing, according to the present invention, end faces of the magnetic film of a magnetostatic-wave resonator are deviated from a plane perpendicular to the plane in which the magnetostatic wave is propagated to suppress the generation of a spurious mode in a wide frequency range.

We claim:

1. A circuit element utilizing a volume magnetostatic wave, the element being responsive to an externally applied magnetic field having a direction, the element comprising:
   means for exciting the magnetostatic wave;
   a medium for propagating the magnetostatic wave in a first plane defined thereby, said medium having end faces, and wherein said first plane is perpendicular to the direction of the applied magnetic field; and
   means for selectively suppressing spurious modes while allowing operation in a main resonance mode over a wide frequency range, said suppressing means including at least a part of said end faces of the medium being deviated from a second plane perpendicular to said first plane in which the magnetostatic wave is propagated.

2. The circuit element utilizing a magnetostatic wave as claimed in claim 1, the element being further responsive to an applied microwave to form a magnetostatic-wave resonator, wherein said propagating medium comprises a thin ferrimagnetic film formed on a non-magnetic substrate, and wherein said exciting means comprises at least one finger electrode and a pair of pad electrodes interconnected by said finger electrodes, formed on the ferromagnetic film to excite a magnetostatic wave in the ferrimagnetic film in response to the microwave applied to the pad electrodes, and to propagate the magnetostatic wave, thereby generating resonance.

3. The circuit element utilizing a volume magnetostatic wave as claimed in claim 1, the element being further responsive to an applied microwave to form a magnetostatic-wave resonator, wherein said propagating medium comprises a thin ferrimagnetic film formed on a non-magnetic substrate, and wherein said exciting means comprises electrode means formed on another substrate, said electrode means on said another substrate being positioned relative to said film to excite a magnetostatic wave in the ferrimagnetic film in response to the microwave applied to the electrode means, and to propagate the magnetostatic wave, thereby generating resonance.

4. The circuit element utilizing a volume magnetostatic wave as claimed in claim 1, wherein said at least a part of said end faces of the medium for propagating the magnetostatic wave are tapered.

5. The circuit element utilizing a volume magnetostatic wave as claimed in claim 1, wherein said propagating medium is a thin film having end faces, said thin film defining said first plane, and wherein at least a part of said end faces of the medium for propagating the magnetostatic wave are inclined at an angle of 2° or more to said second plane perpendicular to said first plane in which the magnetostatic wave is propagated.

6. The circuit element utilizing a volume magnetostatic wave as claimed in claim 1, wherein at least a part of said end faces of the medium for propagating the magnetostatic wave has a stepwise profile in the thickness dimension.

7. The circuit element utilizing a volume magnetostatic wave as claimed in claim 2, wherein said at least part of said medium end faces includes opposed deviated end face portions.

8. The circuit element utilizing a volume magnetostatic wave as claimed in claim 3, wherein said at least part of said medium end faces includes opposed deviated end face portions.

9. The circuit element utilizing a volume magnetostatic wave as claimed in claim 5, wherein said angle is about 20° or less.

10. The circuit element utilizing a magnetostatic wave as claimed in claim 5, wherein said inclined end faces are inclined only over a fraction of the thickness dimension of said thin film medium.

* * * * *